(12) United States Patent
Keller et al.

(10) Patent No.: US 8,390,016 B2
(45) Date of Patent: Mar. 5, 2013

(54) METHOD FOR COATING SEMICONDUCTOR DEVICE USING DROPLET DEPOSITION

(75) Inventors: Bernd Keller, Santa Barbara, CA (US); Ban P. Loh, Durham, NC (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 13/237,789

(22) Filed: Sep. 20, 2011

(65) Prior Publication Data

US 2012/0007126 A1 Jan. 12, 2012

Related U.S. Application Data (62) Division of application No. 12/491,162, filed on Jun. 24, 2009, now Pat. No. 8,043,874, which is a division of application No. 11/328,887, filed on Jan. 9, 2006, now Pat. No. 7,569,406.

(51) Int. Cl.
 *H01L 33/00* (2010.01)
(52) U.S. Cl. ............... 257/98; 257/88; 257/91
(58) Field of Classification Search ............ 257/88, 257/89, 91, 98, 99, 100
See application file for complete search history.

(56) References Cited

U.S. PATENT DOCUMENTS

| | | | |
|---|---|---|---|
| 5,959,316 A | 9/1999 | Lowery et al. | 257/98 |
| 7,067,969 B2 * | 6/2006 | Aoki et al. | 313/486 |
| 7,192,859 B2 | 3/2007 | Yamazaki et al. | 438/597 |
| 7,393,081 B2 | 7/2008 | Maekawa et al. | 438/21 |
| 7,791,092 B2 * | 9/2010 | Tarsa et al. | 257/98 |
| 2002/0009536 A1 | 1/2002 | Iguchi et al. | |
| 2003/0083203 A1 | 5/2003 | Hashimoto et al. | |
| 2004/0104391 A1 * | 6/2004 | Maeda et al. | 257/79 |
| 2005/0076836 A1 | 4/2005 | O et al. | |
| 2008/0135862 A1 | 6/2008 | Maeda et al. | |

FOREIGN PATENT DOCUMENTS

EP 1198016 A2 4/2001

OTHER PUBLICATIONS

Office Action from related U.S. Appl. No. 11/328,887, dated Dec. 11, 2008.
Response to Office Action U.S. Appl. No. 11/328,887, filed Mar. 11, 2009.
Notice of Allowance from U.S. Appl. No. 11/328,887, dated Apr. 15, 2009.
Nichia Corp. White LED, Part No. NSPW312BS, "Specification for Nichia White LED, Model NSPW312BS", pp. 1-14, 2004.
Nichia Corp. White LED, Part No. NSPW300BS, "Specification for Nichia White LED, Model NSPW300BS", pp. 1-14, 2004.
Notice of Allowance from related U.S. Appl. No. 12/491,162, dated Jul. 8, 2011.
Response to Office Action from related U.S. Appl. No. 12/491,162, OA dated Jan. 20, 2011, response dated Apr. 19, 2011.
Office Action from related U.S. Appl. No. 12/491,162, dated Jan. 20, 2011.
Response to Office Action from related U.S. Appl. No. 12/491,162, OA dated Sep. 30, 2010, response dated Nov. 1, 2010.
Office Action from related U.S. Appl. No. 12/491,162, dated Sep. 30, 2010.

* cited by examiner

*Primary Examiner* — Kevin M Picardat
(74) *Attorney, Agent, or Firm* — Koppel, Patrick, Heybl & Philpott (57) ABSTRACT

Methods and systems for coating of semiconductor devices using droplets of wavelength conversion or phosphor particles in a liquid medium. A plurality of nozzles delivers a controlled amount of the matrix material to the surface of the semiconductor device, with each of said nozzles having an opening for the matrix material to pass. The opening has a diameter wherein the diameter of the phosphor particles is less than or approximately equal to one half the diameter of the opening. The phosphor particles are also substantially spherical or rounded. The nozzles are typically arranged on a print head that utilizes jet printing techniques to cover the semiconductor device with a layer of the matrix material. The methods and systems are particularly applicable to covering LEDs with a layer of phosphor materials.

8 Claims, 4 Drawing Sheets

METHOD FOR COATING SEMICONDUCTOR DEVICE USING DROPLET DEPOSITION

This application is a divisional of and claims the benefit of U.S. patent application Ser. No. 12/491,162 to Keller et al., filed on Jun. 24, 2009, U.S. Pat. No. 8,043,874, which is a divisional of and claims the benefit of U.S. patent application Ser. No. 11/328,887 to Keller et al., filed on Jan. 9, 2006, and is now issued as U.S. Pat. No. 7,569,406.

BACKGROUND OF THE INVENTION

1. Field of the Invention

This invention relates to coating of semiconductor devices and to a fabrication method for phosphor converted light emitting diodes (LEDs) for white and colored light generation. Specifically, the invention relates to methods for coating LEDs with a layer of phosphor particles and LED package having LEDs coated using the methods.

2. Description of the Related Art

LEDs convert electric energy to light and they generally comprise an active layer of semiconductor material sandwiched between two oppositely doped layers. When a bias is applied across the doped layers, holes and electrons are injected into the active layer where they recombine to generate light that is emitted omnidirectionally from the active layer and from all surfaces of the LED. Recent advances in LEDs (such as Group III nitride based LEDs) have resulted in highly efficient light sources that surpass the efficiency of incandescent of halogen light sources, providing light with equal or greater brightness in relation to input power.

Conventional LEDs do not generate white light from their active layers. One way to produce white light from conventional LEDs is to combine different wavelengths of light from different LEDs. For example, white light can be produced by combining the light from red, green and blue emitting LEDs, or combining the light from blue and yellow LEDs. This approach, however, requires the use of multiple LEDs to produce a single color of light, increasing the overall cost and complexity. The different colors of light may also be generated from different types of LEDs fabricated from different material systems. Combining different LED types to form a white lamp can require costly fabrication techniques and can require complex control circuitry since each device may have different electrical requirements and may behave differently under varied operating conditions (e.g. with temperature, current or time).

Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowery, "Multiple Encapsulation of Phosphor-LED Devices"]. The surrounding phosphor material "downconverts" the wavelength of some of the LED's blue light, changing its color to yellow. Some of the blue light passes through the phosphor without being changed while a substantial portion of the light is downconverted to yellow. The LED emits both blue and yellow light, which combine to provide white light.

One method for combining an LED with a phosphor layer utilizes volumetric dispense methods (e.g. dispensing using a syringe) for injecting a large enough volume of phosphor containing encapsulating resin or epoxy over the LED to cover the LED. For these methods, however, it can be difficult to control the phosphor layer's geometry and thickness. As a result, light emitting from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the syringe method above, stencil method also presents difficulties in controlling the geometry and layer thickness of the phosphor containing polymer. The stenciling composition may not fully fill the stencil opening such that the resulting layer is not uniform. The phosphor containing composition can also stick to the stencil opening which reduces the amount of composition remaining on the LED. These problems can result in LEDs having non-uniform color temperature and LEDs that are difficult to consistently reproduce with the same or similar emission characteristics.

Another conventional method for coating LEDs with a phosphor utilizes electrophoretic deposition (EPD). The conversion material particles are suspended in an electrolyte based solution. A plurality of LEDs are immersed in the electrolyte solution. One electrode from a power source is coupled to the LEDs, and the other electrode is arranged in the electrolyte solution. The bias from the power source is applied across the electrodes, which causes current to pass through the solution to the LEDs. This creates an electric field that causes the conversion material to be drawn to the LEDs, covering the LEDs with the conversion material.

After the LEDs are covered by the conversion material, they are often removed from the electrolyte solution so that the LEDs and their conversion material can be covered by a protective resin. This adds an additional step to the process and the conversion material (phosphor particles) can be disturbed prior to the application of the epoxy. During the deposition process, the electric field in the electrolyte solution can also vary such that different concentrations of conversion material can be deposited across the LEDs. The conversion particles can also settle in the solution which can also result in different conversion material concentrations across the LEDs. The electrolyte solution can be stirred to prevent settling, but this presents the danger of disturbing the particles already on the LEDs.

SUMMARY OF THE INVENTION

Briefly, and in general terms, this invention relates to coating of semiconductor devices using droplets of wavelength conversion or phosphor particles in a liquid medium. One embodiment of a system according to the present invention for depositing a layer of phosphor material comprises a semiconductor device, and a reservoir for holding a matrix material comprising phosphor particles mixed in a liquid medium. A plurality of nozzles is included each of which delivers a controlled amount of the matrix material to the surface of the semiconductor device, and each of said nozzles having an opening for the matrix material to pass. The opening has a diameter wherein the diameter of the phosphor particles is less than or approximately equal to one half the diameter of the opening. An apparatus imparts movement between the semiconductor device and the nozzles to allow the delivery of the matrix material over at least a portion of the surface of said semiconductor device.

Another embodiment of a system according to the present invention for depositing a layer of phosphor material comprises a semiconductor device, and a reservoir for holding a matrix material having phosphor particles. A print head is included over the semiconductor device and comprising a plurality of nozzles, said matrix material provided to each of said nozzles. Each of said nozzles comprises a nozzle opening and a mechanism for causing a droplet of matrix material to be forced out of the nozzle through the opening and onto the semiconductor device. The nozzle has an opening having a diameter, with the diameter of the wavelength conversion particles being one to two orders of magnitude smaller than the diameter of the nozzle opening, and the wavelength conversion particles being substantially rounded.

One embodiment of a method according to the present invention for depositing a layer of phosphor material on a semiconductor device comprises providing a semiconductor device and providing a print head with a plurality of nozzles. Each of the nozzles is capable of depositing a droplet of matrix material on the semiconductor device. The said matrix material comprising a phosphor in a liquid medium. A layer of matrix material droplets is deposited from the nozzles on the semiconductor device with a uniform pitch between adjacent droplets, and the droplets are allowed to spread and flow together under gravity or surface tension to form a layer of matrix material on the semiconductor device. The liquid medium is allowed to evaporate leaving a layer of essentially only phosphor particles on the semiconductor device.

Another method according to the present invention for depositing a layer of phosphor material on an LED comprises providing an LED, and providing a reservoir of matrix material comprising substantially spherical wavelength conversion particles in a liquid medium. The matrix material is formed into droplets, and the droplets are deposited on the LED with the droplets forming a layer of phosphor particles on the LED.

One embodiment of a light emitter package according to the present invention comprises a solid state emitter having a plurality of semiconductor layers, the emitter emitting light in response to an electrical bias. A layer of phosphor material covering at least a portion of the emitter, the layer comprising substantially rounded conversion particles deposited on the emitter through a print head nozzle. The layer of conversion material down-converts the wavelength of at least some of said emitter light.

Another embodiment of a light emitter package according to the present invention comprises a solid state emitter having a plurality of semiconductor layers, the emitter emitting light in response to an electrical bias. A layer of phosphor material covers at least a portion of the emitter, the layer comprising conversion particles deposited on the emitter through a print head nozzle. The nozzle having an opening wherein the diameter of the conversion particles is less than or approximately equal to half the diameter of the opening, said. The layer of conversion material absorbs and down-converts at least some of the emitter light.

These and other aspects and advantages of the invention will become apparent from the following detailed description and the accompanying drawings which illustrate by way of example the features of the invention.

DETAILED DESCRIPTION OF THE INVENTION

The present invention relates to a method and apparatus for conformal coating a semiconductor device with a matrix material comprised of wavelength conversion particles in a liquid medium, with the method and apparatus using jet printing technology. In particular, the wavelength conversion particles can comprise phosphor particles and the methods and apparatus can provide for conformal coating of a semiconductor device with the phosphor particles without the need for dispensing a volume of phosphor containing encapsulant, or an electric field driven deposition process.

The present invention is described herein with reference to certain embodiments but it is understood that the invention can be embodied in many different forms and should not be construed as limited to the embodiments set forth herein. The present invention is described herein with reference to a "droplet" that can be delivered to a semiconductor device, and it is understood that this term includes any controlled amount of delivered to the surface of the semiconductor device, including a droplet, micro-droplet, stream, mist, etc.

The invention is particularly applicable to fabrication of white LED emitters that generate white light by down converting blue or UV light with suitable phosphor materials. The present invention provides white LED emitters where the uniform conformal layer of phosphor particles is deposited directly on the surface of the LED chip to provide a white light source with superior emission characteristics including angular uniform color of white emission (far field), spatially uniform color of white emission from the LED source (near field), and a white source with maximum luminance, i.e. emission is generated from a minimal source area.

Figure 1:
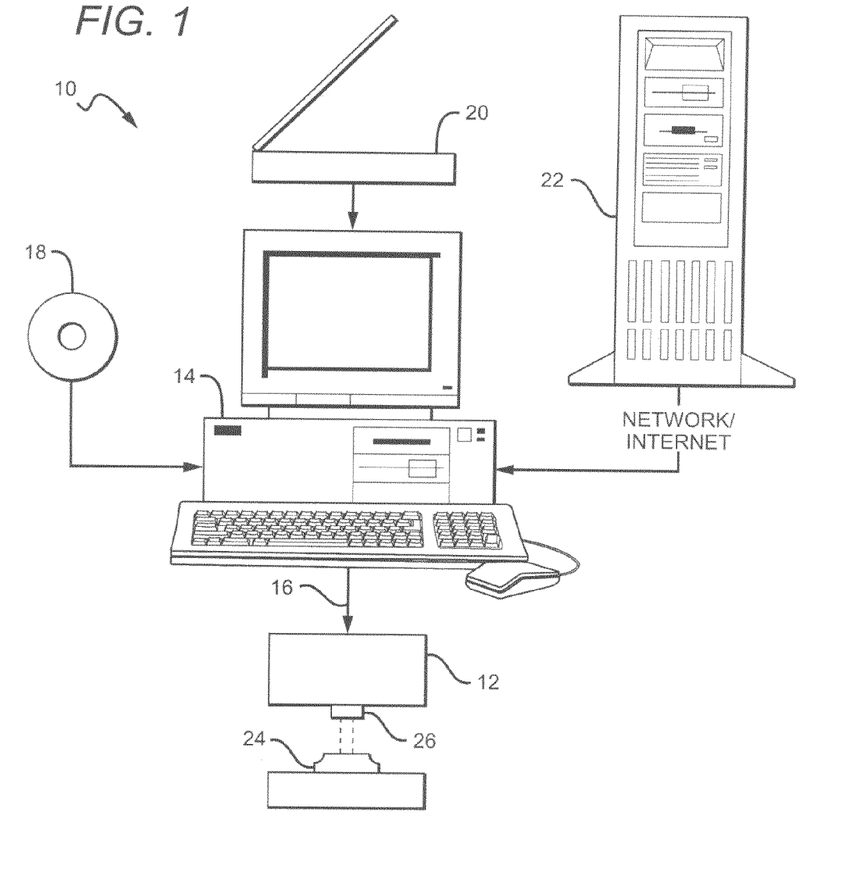
FIG. 1 shows one embodiment of a phosphor deposition system according to the present invention.

FIG. 1 shows one embodiment of a system 10 according to the present invention for depositing a layer of phosphor on a device, and in particular an LED. The system 10 comprises a conventional ink jet printer 12, which can be any number of printers with a suitable printer being model number DMP 2800 provided by Dimatix Incorporated. Ink Jet printers are generally known in the art and are only briefly described herein. Ink jet printing is a non impact printing method wherein ink is emitted from nozzles in a print head as the print head passes over the media (e.g. paper or an LED as described herein). Liquid is held in a reservoir (typically in the print head) and is delivered to and sprayed from the nozzles onto the media as the print head scans the media in horizontal strips. At the same time the media is moved forward in steps under the print head. A strip of the liquid is deposited on the media in a strip and the media is moved for printing of the next strip. In some embodiments, the print head can deposit multiple strips of liquid in each pass by having multiple print heads. In other embodiments the print head can be angled to deposit on angled or vertical surfaces, or multiple print heads can be provided one or more of which can be angled.

The printer 12 typically operates in communication with and under the control of a computer 14, which is typically a conventional personal computer (PC), although other computers can also be used. The control signals and pattern to be printed are transferred from the PC to the printer over a standard communications bus 16. The pattern for printing can be generated on the PC 14 using software such graphics software resident on the PC 14. Alternatively the pattern can be loaded on the PC 14 from a peripheral device such as compact disk 18, a scanner 20, or a server 22. The server 22 can provide information from a computer network or from over the Internet. When the appropriate data is loaded in the printer 12 from the PC 14, and the LED (or other device) 24 is properly loaded in the printer 12, the print head 26 can deposit a layer of phosphor material on the LED 24.

Figure 2:
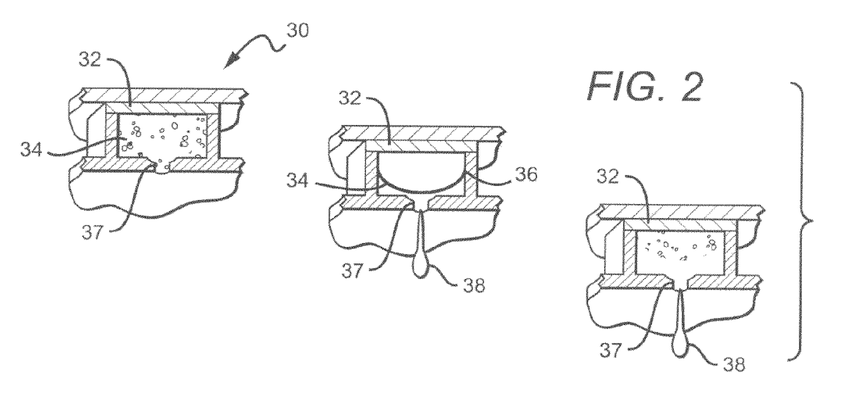
FIG. 2 shows one embodiment of a thermal bubble print head nozzle that can be used according to the present invention for depositing phosphors.

Jet print heads typically contain a series of nozzles each of which is arranged to deposit droplets of liquid on the LED 24 in the printer 12. Depending on the manufacturer and model of the printer, liquid (ink) cartridges are used as the supply of liquid to be deposited on the media, and in some models the cartridges include the print head itself. Different types of printers form droplets using different types of nozzles. FIG. 2 shows one known nozzle 30 commonly referred to as bubble jet or thermal bubble in steps of its droplet formation. This technology uses tiny resistors 32 located in the liquid holder 34 of each nozzle 30. A signal is applied to the resistors 32 to create heat that vaporizes the liquid (ink) in the holder 34 to form a bubble 36. As the bubble 36 expands, some of the ink is pushed out of the nozzle opening 37 in the form of a droplet 38. When the bubble 36 pops (collapses) a vacuum is created that pulls more ink into the nozzle reservoir 34.

Figure 3:
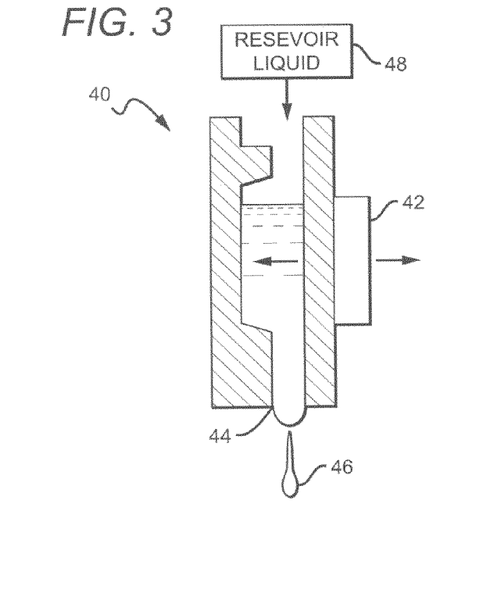
FIG. 3 shows one embodiment of a piezo crystal print head nozzle that can be used according to the present invention for depositing phosphors.

FIG. 3 shows another common nozzle 40 that uses a piezo crystal 42, located such that its movement under a bias causes formation of a liquid droplet 46. An electrical signal is applied to the piezo crystal 42 causing it to vibrate. When the crystal 42 vibrates inward, a controlled amount of liquid is forced out of the nozzle 40, through the nozzle opening 44 and in the form of a droplet 46. When the piezo crystal 42 vibrates out, liquid is pulled into the nozzle 40 from the reservoir 48 to replace the liquid forced out. Typical print heads having thermal bubble and piezo crystal nozzles can have 300 to 600 tiny nozzles, all of which can be fired simultaneously, or sequentially as needed. The typical diameter for each nozzle opening is in the range of 30-50 microns.

Figure 4:
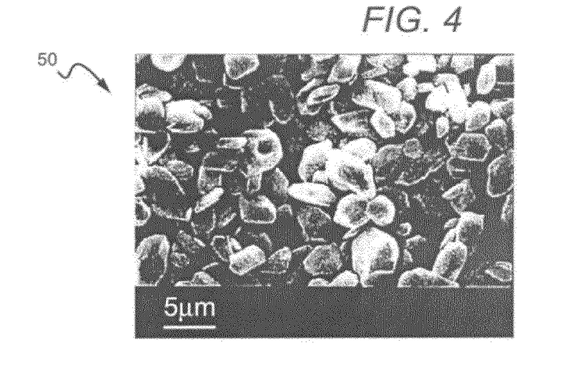
FIG. 4 is photo showing conventional phosphors.

FIG. 4 shows typical phosphor particles 50 (such as YAG: Ce garnets) that range in size from 3 to 30 microns or larger. In the past, jet printing systems using phosphors of this size and shape have been hampered by poor equipment and process reliability. The size of these particles can clog the print head nozzles, and in particular those particles having a diameter that is greater than one half the diameter of the nozzle opening. The danger of clogging increases as the particle diameters approach and exceed the size of the nozzle opening. The sharp edges of these particles also can be problematic. For particles being small enough to pass through a nozzle, the sharp edges act as an abrasive at the nozzle opening and can damage the nozzle. Using this particle the nozzle can fail in a relatively short time.

Figure 5:
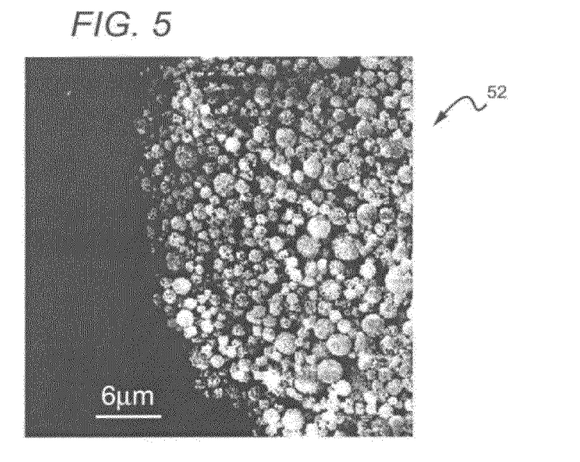
FIG. 5 is a photo showing phosphors that can be used in the ink jet printing systems according to the present invention.

FIG. 5 shows phosphor particles 52 that can more reliably be used in phosphor jet printing deposition processes according to the present invention. The phosphors are significantly smaller and lack the sharp edges. These phosphors can range in size from approximately ½ to 10 microns, with a preferred range of sizes being 1-6 microns. These phosphors have a substantially rounded or spherical shape without sharp edges. Phosphor particles of this type can be fabricated using different methods, with one suitable method being spray pyrolysis. Pyrolysis generally involves atomizing an aqueous solution of precursors in a stream, and the stream consisting of droplets suspended in a carrier gas is passed through a tubular furnace. In the furnace, the precursor reacts in the solid phase, forming the final product powder of phosphor particles in the desired shape and size. Using these particle can result in more precise and repeatable fabrication of white emitting LEDs.

Figure 6:
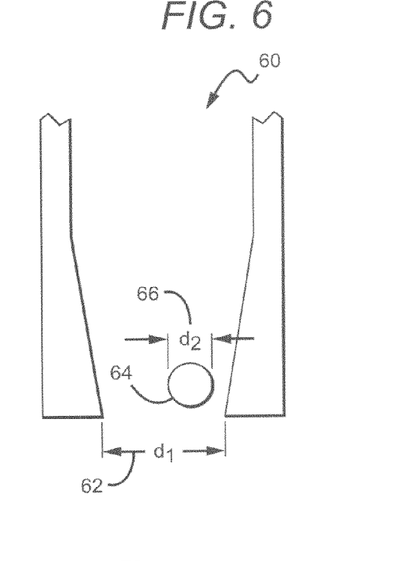
FIG. 6 is a schematic illustrating the preferred size of phosphor particles and nozzle opening in phosphor deposition systems according to the present invention.

FIG. 6 shows a print head nozzle 60 according to the present invention that has a nozzle diameter ($d_1$) 62, and a phosphor particle 64 having a diameter ($d_2$) 66. For phosphor particles to be reliably used in depositing phosphors according to the present invention, the particle diameter 66 and nozzle diameter 62 should have a size relationship that allows the phosphor particles to easily pass through the nozzle without clogging. In one embodiment according to the present invention, the phosphor particle diameter 66 should be less than or approximately equal to one half the nozzle diameter 62. In another embodiment, the particle diameter 66 should be one to two orders of magnitude smaller than the nozzle diameter 62. The particles should also lack sharp edges and be substantially spherical and round as described above so that the nozzle is not damaged by sharp edges as the phosphor passes through. Although the particles do not need to be spherical (as shown in FIG. 5), is it preferable that the particles be substantially spherical, or as close to spherical as possible to avoid damage to the nozzle. It can be appreciated from this size relationship between the nozzle diameter and particle diameter that the smaller phosphor particle diameter, the smaller the nozzle diameter that can be used. As nozzles are developed with larger diameters, phosphors of a larger diameter can be used.

Figure 7:
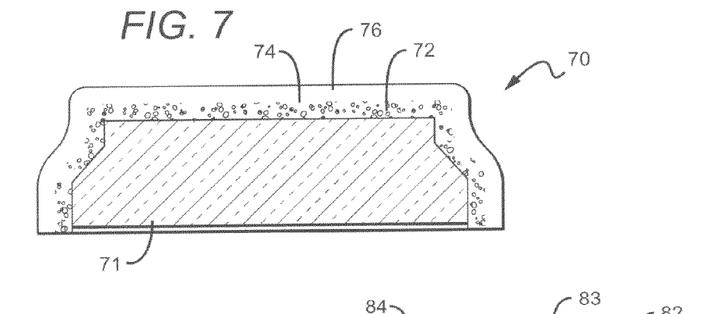
FIG. 7 is a sectional view of an LED with a layer of phosphor deposited according to the present invention in a volatile medium.

The phosphor particles can be one or more fluorescent or phosphorescent materials such as a phosphor, fluorescent dye or photoluminescent semiconductor. The following lists of some of the phosphor particles that can be used in the methods and apparatus according to the present invention, grouped by the re-emitted color following excitation:

Red
$Y_2O_2S:Eu^{3+},Bi^{3+}$
$YVO4:Eu^{3+},Bi^{3+}$
$SrS:Eu^{2+}$
$SrY_2S_4:Eu^{2+}$
$CaLa_2S_4:Ce^{3+}$
$(Ca,Sr)S:Eu^{2+}$ $Y_2O_3:Eu^{3+},Bi^{3+}$
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$Sr_2CeO_4$
$SrTiO_3:Pr^{3+},Ga^{3+}$
Orange
$SrSiO_3:Eu,Bi$
Yellow/Green
$YBO_3:Ce^{3+},Tb^{3+}$
$BaMgAl_{10}O_{17}:Eu^{2+},Mn^{2+}$
$(Sr,Ca,Ba)(Al,Ga)_2S_4:Eu^{2+}$
$ZnS:Cu^+,Al^{3+}$
$LaPO_4:Ce,Tb$
$Ca_8Mg(SiO_4)_4Cl_2:Eu^{2+},Mn^{2+}$
$((Gd,Y,Lu,Se,La,Sm)_3(Al,Ga,In)_5O_{12}:Ce^{3+}$
$((Gd,Y)_{1-x}Sm_x)_3(Al_{1-y}Ga_y)_5O_{12}:Ce^{3+}$
$(Y_{1-p-q-r}Gd_pCe_qSm_r)_3(Al_{1-y}Ga_y)_5O_{12}$
$Y_3(Al_{1-s}Ga_s)_5O_{12}:Ce^{3+}$
$(Y,Ga,La)_3Al_5O_{12}:Ce^{3+}$
$Gd_3In_5O_{12}:Ce^{3+}$
$(Gd,Y)_3Al_5O_{12}:Ce^{3+},Pr^{3+}$
$Ba_2(Mg,Zn)Si_2O_7:Eu^{2+}$
$(Y,Ca,Sr)_3(Al,Ga,Si)_5(O,S)_{12}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$
Blue
$ZnS:Ag,Al$
Combined Yellow/Red
$Y_3Al_5O_{12}:Ce^{3+},Pr^{3+}$
White
$SrS:Eu^{2+},Ce^{3+},K^+$ From the list above, the following phosphors are most suitable for use in deposition on LEDs having excitation in the blue and/or UV emission spectrum, by providing a desirable peak emission, having efficient light conversion, and by having acceptable Stokes shift:
Red
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3:Pr^{3+},Ga^{3+}$
Yellow/Green
$(Sr,Ca,Ba)(Al,Ga)_2S_4:Eu^{2+}$
$Ba_2(Mg,Zn)Si_2O_7:Eu^{2+}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$ As mentioned above, the uniform coating of LEDs according to the present invention is provided by jet printing LEDs with a conformal coat of phosphor material with the phosphor being mixed with and delivered in a liquid medium. The phosphor particles can be mixed in many different mediums and held in a print head reservoir for deposition according to the present invention. In one embodiment, the phosphor particles can be suspended in a volatile organic or inorganic medium that dries shortly after the phosphor/medium mixture is deposited. FIG. 7 shows one embodiment of an emitter 70 comprising an LED 71 covered with a layer of phosphor particles 72 that were deposited in a volatile medium. After deposition, the volatile medium evaporates, leaving only the layer of phosphor particles 72. Air gaps 74 can form between adjacent particles, and because of the difference in the index of refraction for air and the surrounding semiconductor and phosphor materials, the air gaps can reduce light extraction efficiency. To fix the phosphor particles 72 in place they can then be covered by a layer of curable material 76, such as an epoxy, silicone or glass. When the particles are covered, it is desirable for the curable material to fill the air gaps 74 to reduce the negative impact on light extraction. Many different volatile mediums can be used, including but not limited to alcohol, water, isopropynol, hydrocarbon solvents, hexane, methanol, methyl ethyl katone, ethylene glycol, and combinations thereof.

Figure 8:
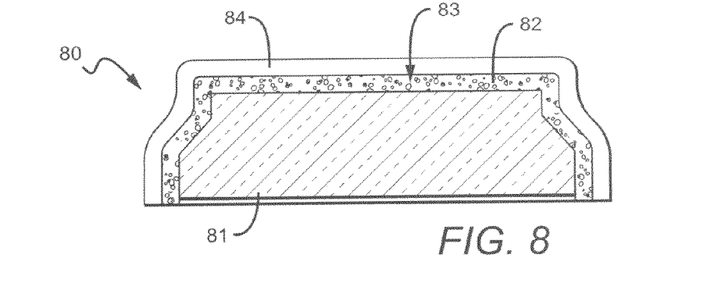
FIG. 8 is a sectional view of an LED with a layer of phosphor deposited according to the present invention in a non-volatile medium.

FIG. 8 shows another embodiment of an emitter 80 also comprising an LED 81 covered with a layer of phosphor particles 82 delivered in a phosphor particle non-volatile medium mixture. The non-volatile medium can be organic or inorganic and after delivery of the mixture, the particles remain suspended in a non-volatile medium to form a phosphor particle layer 83. Many different materials can be used for the non-volatile medium including but not limited to silicon oils and hydrocarbon oils. When the non-volatile medium and phosphor is deposited the phosphor particles remain immobilized and fixed in place by the medium. The device can then be encapsulated by an epoxy, silicone or glass layer 84 that covers the phosphor particle layer 82. One advantage of this embodiment is that the likelihood of air gaps forming in the phosphor layer 82 is greatly reduced because the non-volatile medium tends to fill all the gaps.

Figure 9:
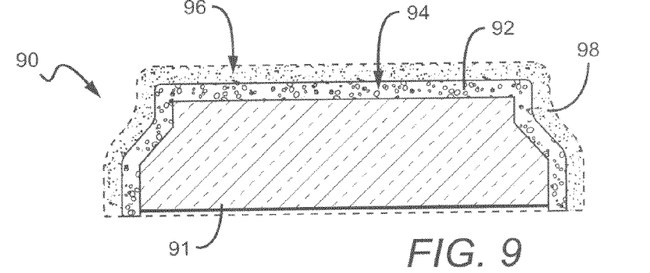
FIG. 9 is a sectional view of an LED with a layer of phosphor deposited according to the present invention in a curable medium.

FIG. 9 shows another embodiment of an emitter 90 comprising an LED 91 having phosphor particles 92 delivered in a phosphor particle curable organic or inorganic medium mixture. The curable organic or inorganic medium can comprise any number of curable materials such as silicone or epoxy. The resulting particle curable medium layer 94 can be deposited on the device to form a single epoxy phosphor layer that can then be cured. The curing of the layer 94 fixes the phosphor particles in place, while at the same time providing a hardened protection layer. The device can then be over coated with an additional encapsulating layer 96 for additional protection. Further, curable or non-curable non-volatile materials can be delivered also in combination with volatile mediums which can act as solvents for them.

Each of the emitters 70, 80 and 90 can also have scattering particles 98 (shown in FIG. 9) to help scatter emitting light. The particles layers are shown in FIG. 9 in the encapsulating layer 96, but also can be deposited with the phosphor particle layers, or in both. Many different types of scattering particles can be used, with the preferred scattering particles being made of barium sulfate or titanium dioxide.

For each of the phosphor medium mixtures described above and shown delivered on the emitters in FIGS. 7-9, the mixture should have a viscosity that allows it to be efficiently deposited by the a jet print head such as those described above and shown in FIGS. 2 and 3. If the viscosity is too low its surface tension can be low enough that the mixture can run out of the print head through the nozzle openings. If the viscosity is too high, the force from thermal bubble or piezo crystal, as the case may be, may be insufficient to force a drop of mixture through the nozzle. Many different ranges of viscosity can be used depending on the diameter of the nozzle opening and the force of the thermal bubble or piezo crystal. For conventional piezo print heads, a suitable range of viscosity is 8-20 centipoise (cp), although other mixture viscosities can also be used. If the viscosity is not within a suitable range, solvents can be added to lower the viscosity, or fillers can be added to increase the viscosity. Examples of volatile solvents that can be used to include water or methyl ethyl ketone.

The use of conventional sized phosphor particles in ink jet printing also presented a problem with settling of the phosphor in the phosphor medium mixture. Settling can result in layers of different phosphor concentration being deposited, which can reduce the repeatability of the phosphor deposition. Smaller particles according to the present invention and shown in FIG. 4 provide the additional advantage of remaining suspended longer in the medium having a viscosity in the range described above. This allows for more repeatable deposition of the phosphor layer.

Another aspect of the present invention provides for the coating of a semiconductor chip (LED) surface with thin layer(s) of phosphor containing fluids by precisely targeting and depositing droplets of the fluids repeatedly at a frequency on predetermined spots on the surface. A short time is then provided for the fluids droplets to spread and flow into adjacent droplets under gravity or surface tension to form a thin film on the surface. The chemical fluids may be made more viscous or solidified to form a permanent coating by evaporating off the fluid solvents of chemical changes initiated by heat or radiation.

Figure 10:
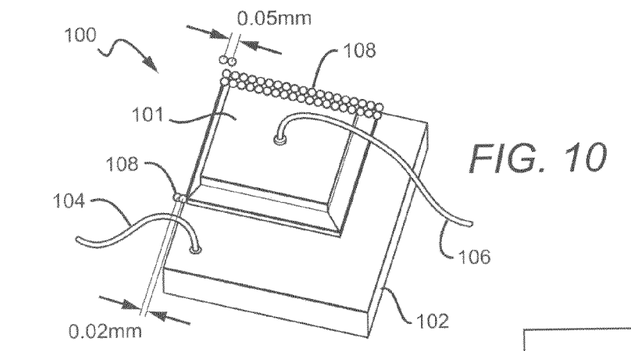
FIG. 10 is a perspective view of an LED with phosphor/medium droplets deposited according to the present invention.

FIG. 10 shows one embodiment of an emitter 100 according to the present invention partially covered by droplets 108 of a phosphor particle liquid medium mixture. The LED 100 comprises an LED 101 on a submount 102, with a first bond wire 104 coupled to the submount 102 and a second wire bond 106 coupled to the LED 101. A bias applied across the wire bonds 104, 106 is applied to the LED 101 to cause it to emit light. The droplets 108 can comprise different mixtures according to the present invention, with the preferred mixture being one of the mixtures described above in the description of the emitters in FIGS. 7-9. Solid powders, such as phosphor particles, that are designed to coat the chip to perform certain functions on the chip are preferably spherical shapes of micron or sub-micron sizes, although the powders can also be certain other irregular shapes.

After the droplets 108 are deposited on the LED 101, gravity and surface tension causes the droplets to run together to form a layer of phosphor particle medium mixture. Depending on the size of the droplets 108 and the distance between adjacent droplets 108 (pitch), droplets will form layers of different thickness. The LED 101 is shown with droplets 108 having a pitch of 0.05 millimeters (mm) on the top surface, and droplets with a pitch of 0.02 mm on another surface. These different pitches for the droplets can result in mixture layers of different thickness.

Figure 11:
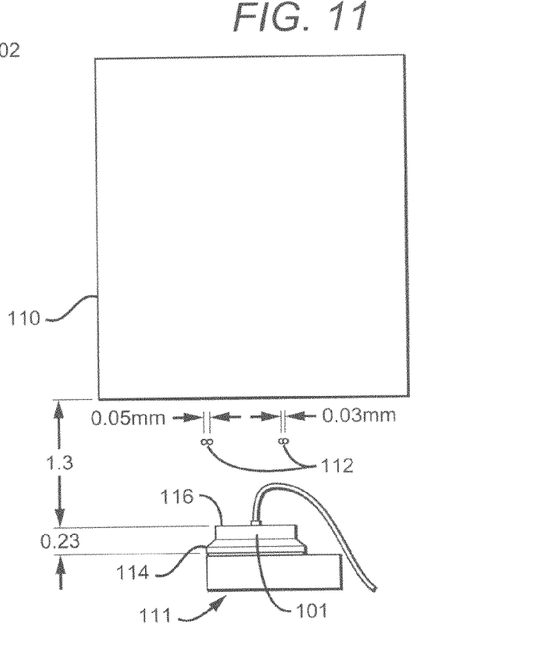
FIG. 11 is diagram showing phosphor/medium droplets deposited by a print head according to the present invention.

The droplets 108 are preferably positioned and deposited on the LED 101 using jet printing as described above. Jet printing technology, provides droplets 108 of matrix material comprising phosphor particles in a liquid medium. The droplets 108 are deposited to form a coating of a desired thickness and the layer thickness can be positively controlled by the size of the nozzle, pitch between adjacent droplets, and viscosity of the droplets. FIG. 11 shows a jet print head 110 positioned over the emitter 111 that is similar to the emitter 100 in FIG. 10, and is shown as it would be arranged in one printing system according to the present invention. The droplets 112 can be deposited from the print head 110 through nozzles such as those described above and the matrix can be any one of the phosphor particle medium mixtures described above such as phosphor particles in a volatile, non-volatile or curable medium.

FIG. 11 shows droplets being deposited on the top surface of an LED 112 with a 0.05 mm pitch and a 0.03 pitch between droplets. The different pitch can be controlled by having a print head with the appropriate distance between adjacent nozzles. Alternatively, the movement of the print head or LED under the print head can be controlled to give the appropriate droplet pitch. By using a layer of droplets with a controlled distance between adjacent droplets, a layer of controlled thickness can be formed. Droplets can be deposited on the angled surfaces 114 and vertical surfaces 116 of the LED 112 using angled print heads (not shown). Alternatively, larger droplets can be deposited on the top surface of the LED 112 and as gravity and surface tension cause the droplets to form a layer, the droplet fluids can run down the angled and vertical surfaces 114, 116.

The droplets are preferably delivered in phosphor particle volatile liquid medium, with the medium evaporating shortly after the droplets are deposited and run together. After the volatile medium evaporates the remaining phosphor particles typically form a phosphor layer that is a fraction of a micron thick. If this is the desired thickness for the layer, the LED can be encapsulated to fix the phosphors. To form thicker layers, the print head can pass over and deposit additional layers to build up the desired thickness. The pitch, viscosity and print head speed on provided by each pass of the print head can determine the thickness of each layer as the layers are built up.

Figure 12:
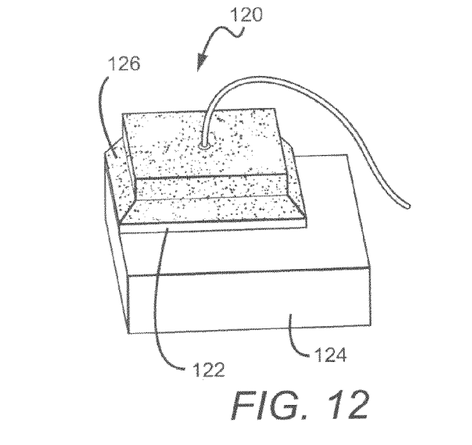
FIG. 12 shows an LED after coating with a phosphor according the present invention.

FIG. 12 shows one embodiment of an emitter 120 also comprising an LED 122 mounted to a submount 124. The LED 122 is coated by a layer 126 of phosphor particles according to the present invention. Different embodiments of the phosphor particles material can have different characteristics. In one embodiment, phosphor particle layer 126 can absorb some wavelengths of light emitted by the LED and re-emit other wavelengths, thus resulting in different colors. In another example, barium sulfate or titanium dioxide (scattering) particles that are suspended in a clear silicone or epoxy will disperse light rays emitted by the LED chip in all directions. In still another example, nano particles of certain chemicals when coated LED may actually modify the wavelengths emitted by the LED.

The invention provides uniform layer(s) of coating having few microns thickness and can be formed precisely and efficiently on semiconductor chips that have been wire bonded, without breaking either the chip or the wires. In one embodiment, a blue LED chip can be coated with thin, uniform layers of yellow phosphors that produce a more uniform white light and higher efficacy (light output/power output) than an LED covered using prior injection or EPD methods. Jet printing techniques can be used to produce droplets for coating, which have an inherently better material efficiency and productivity than conventional dispensing or electrophoretic deposition techniques, hence a lower cost. The process of coating can be done at a high speed with print heads that typically have hundreds of nozzles; and a printer may be equipped with a plurality of print heads.

Precise phosphor placement on shaped LED chips is possible with ink jet nozzle arrays, with some arranged at varying angles. Small dispense volumes in the range of pico-liters allow for spatial variation of the phosphor deposition across the chip, if desired. Jet printing offers the flexibility in dispense capability to place conformal coating of various phosphors either simultaneously or as a layer sequence on the LED chip to achieve emission at various color points.

Although the present invention has been described in detail with reference to certain preferred configurations thereof, other versions are possible. The printer according to the present invention can be used to coat many devices beyond LEDs and can deposit materials beyond phosphors. Therefore, the spirit and scope of the invention should not be limited to the versions described above.

We claim:

1. A light emitter package, comprising:
a solid state emitter having a plurality of semiconductor layers, said solid state emitter emitting light in response to an electrical bias; and
a layer of phosphor material covering at least a portion of said solid state emitter, said layer of phosphor material comprising substantially rounded conversion particles deposited on said solid state emitter through a print head nozzle, such that gravity and surface tension cause said phosphor material to form a conformal coating on at least a portion of said solid state emitter, wherein said layer of phosphor material down-converts the wavelength of at least some of said emitter light.

2. The light emitter package of claim 1, wherein said solid state emitter comprises a light emitting diode (LED).

3. The light emitter package of claim 1, wherein said conversion particles are deposited on said solid state emitter in a liquid medium.

4. The light emitter package of claim 1, wherein said phosphor material down-converts the wavelength of less than all of said emitter light, said light emitter package emitting a combination of light from said solid state emitter and phosphor material.

5. A light emitter package, comprising:
a solid state emitter having a plurality of semiconductor layers, said solid state emitter emitting light in response to an electrical bias; and
a layer of phosphor material covering at least a portion of said solid state emitter, said layer of phosphor material comprising substantially rounded conversion particles deposited on said solid state emitter through a print head nozzle, such that gravity and surface tension cause said phosphor material to form a conformal coating on at least a portion of said solid state emitter, said print head nozzle having an opening wherein the diameter of said conversion particles is less than or approximately equal to half the diameter of said opening, said layer of phosphor material absorbing and down converting at least some of said emitter light.

6. The light emitter package of claim 5, wherein said solid state emitter comprises a light emitting diode (LED).

7. The light emitter package of claim 5, wherein said conversion particles are deposited on said solid state emitter in a liquid medium.

8. The light emitter package of claim 5, wherein said phosphor material down-converts the wavelength of less than all of said emitter light, said package emitting a combination of light from said solid state emitter and phosphor material.

* * * * *